United States Patent
Shida et al.

(10) Patent No.: US 6,923,414 B2
(45) Date of Patent: Aug. 2, 2005

(54) STAND FOR INSTALLING PLURALITY OF BOX BODIES

(75) Inventors: Arata Shida, Kawasaki (JP); Isao Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/673,318

(22) Filed: Sep. 30, 2003

(65) Prior Publication Data

US 2004/0061036 A1 Apr. 1, 2004

(30) Foreign Application Priority Data

Sep. 30, 2002 (JP) ......................................... 2002-286470

(51) Int. Cl.$^7$ .............................................. A47B 91/00
(52) U.S. Cl. .................................. 248/346.07; 248/676
(58) Field of Search ........................ 248/346.07, 346.01, 248/127, 147, 176.1, 676, 149, 448; 364/708.1; 361/683, 686; 403/329, 339, 340; 211/43

(56) References Cited

U.S. PATENT DOCUMENTS

| | | | | |
|---|---|---|---|---|
| 4,106,735 A | * | 8/1978 | Partain et al. ................. 410/49 |
| 5,183,163 A | * | 2/1993 | Slaiken ......................... 211/43 |
| 5,295,648 A | * | 3/1994 | Hames ......................... 248/149 |
| 5,308,037 A | * | 5/1994 | Gonzalez ..................... 248/670 |
| 6,091,602 A | * | 7/2000 | Helot .......................... 361/686 |
| 6,352,162 B1 | * | 3/2002 | Yang et al. ................... 211/43 |
| 6,364,278 B1 | * | 4/2002 | Lin et al. ..................... 248/676 |
| 6,471,180 B1 | * | 10/2002 | Cunningham ............... 248/640 |
| 6,494,428 B1 | * | 12/2002 | Robbins et al. ........... 248/311.2 |
| 6,805,327 B1 | * | 10/2004 | Shen ..................... 248/346.07 |

FOREIGN PATENT DOCUMENTS

JP          06-350261          12/1994

* cited by examiner

Primary Examiner—Ramon O Ramirez
(74) Attorney, Agent, or Firm—Staas & Halsey LLP

(57) ABSTRACT

A stand for installing a plurality of box bodies is capable of reducing a space needed for installing the plurality of box bodies in parallel and preventing interference with heat radiation of each box body. A stand 5 for installing a plurality of each box bodies 81 in parallel includes a pair of outer stands 51, 51 holding the box bodies 81 disposed on the outer sides from the sides of outer surfaces of the box bodies 81, a middle stand 52 disposed between these outer stands 51, 51 and holding both of the box bodies 81, 81 adjacent to each other from the face-to-face sides thereof, and a connection mechanism detachably connecting the stands 51 52.

6 Claims, 11 Drawing Sheets

STAND FOR INSTALLING PLURALITY OF BOX BODIES

BACKGROUND OF THE INVENTION

The present invention relates generally to a stand for installing a plurality of box bodies and more particularly to a stand suitable when using peripheral devices to a computer in a way that places them vertically.

A box body of each of the peripheral devices to the computer is, in the great majority of cases, formed substantially in a rectangular parallelopiped shape. Further, the box body has been increasingly thinned and downsized over the recent years. In the case of vertically installing such a thin type box body, it is required that a fall-down thereof be prevented. It is therefore general to secure the stand to the bottom of the box body.

Figure 8:
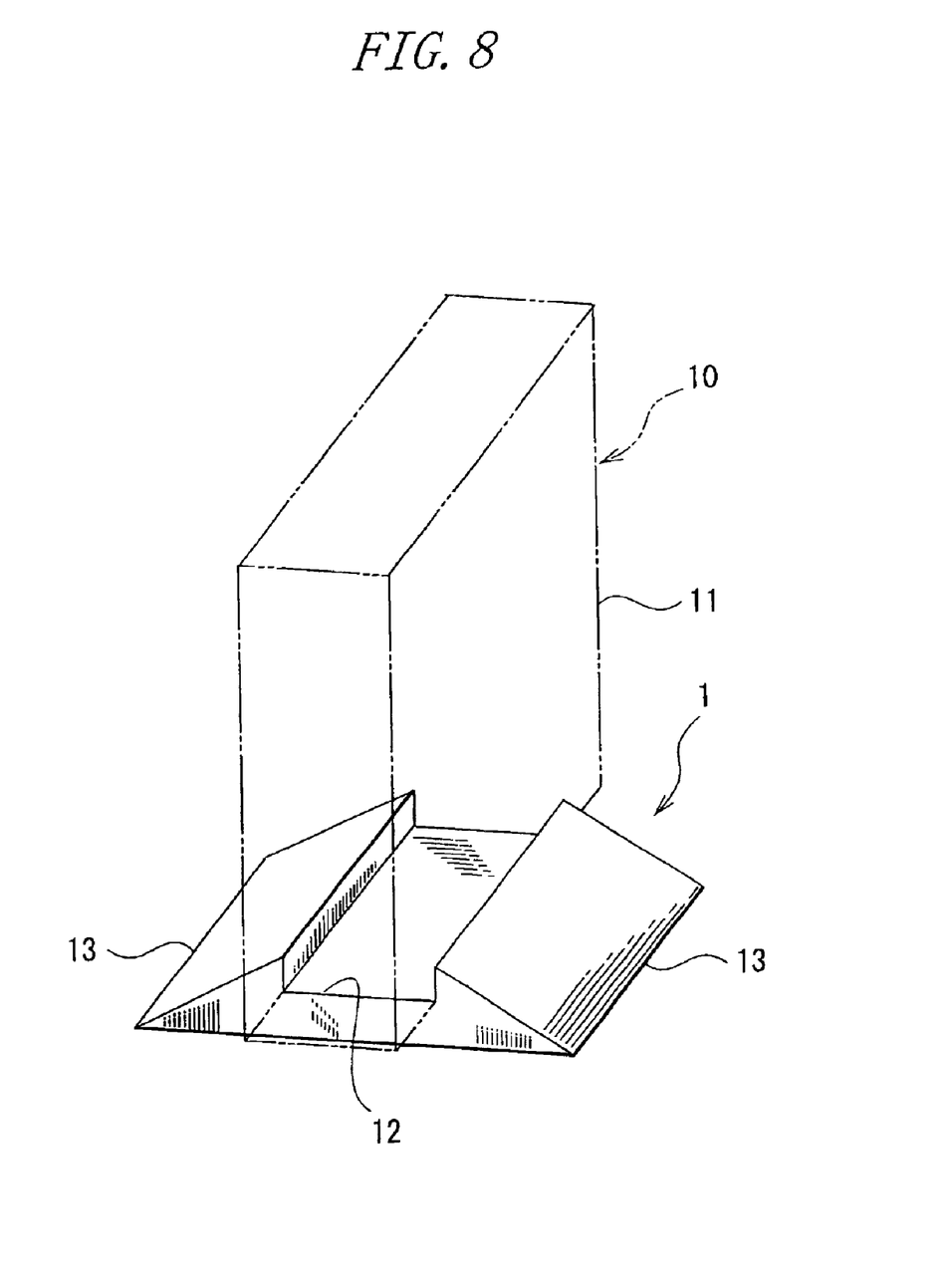
FIG. 8 is a perspective view showing an example of the prior art.

FIG. 8 shows a conventional stand 1. This stand 1 includes a recessed portion 12 for accommodating the bottom of a box body 11 in a peripheral device 10 to the computer, and legs 13, 13 protruding sideways from both sides of this recessed portion 12 and each taking substantially a triangular shape in section. A size of each of the legs 13, 13 is determined depending on the box body 11.

Figure 9:
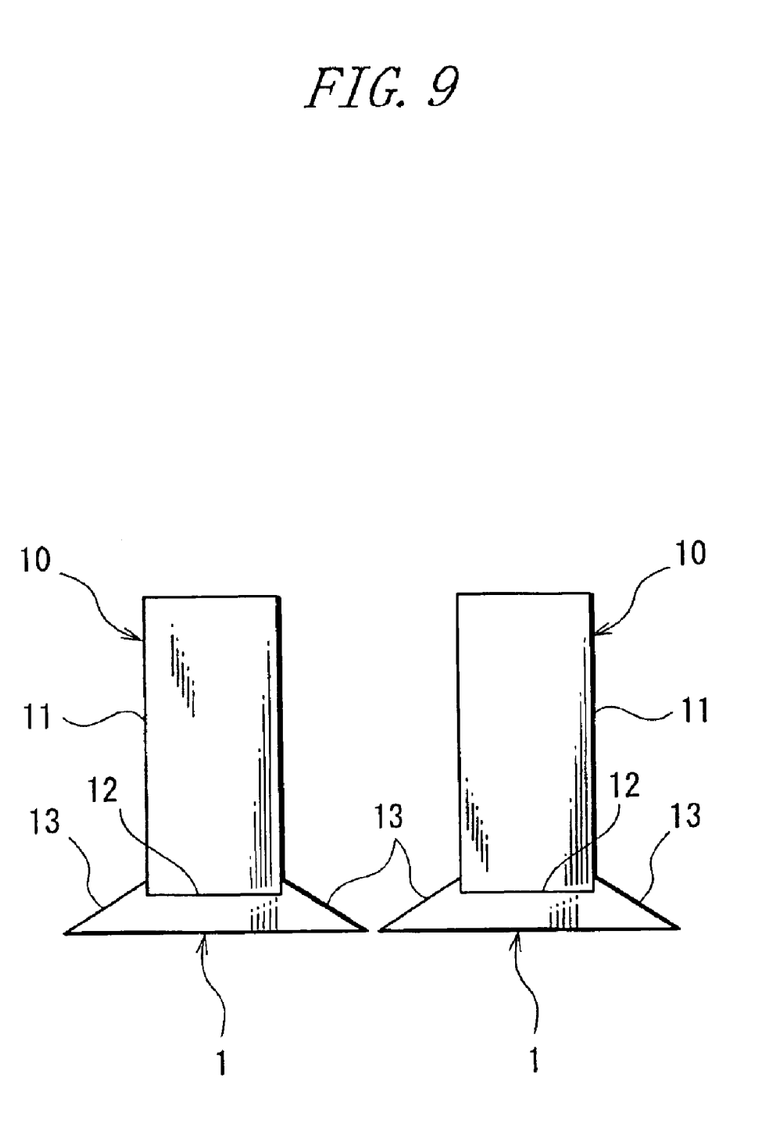
FIG. 9 is a front view showing an operation of the prior art.

In the case of using a plurality of peripheral devices 10, as shown in FIG. 9, the stands 1, 1 are secured to the box bodies 11, 11 of the peripheral devices 10, 10. Then, it is an ordinary way that the box bodies 11, 11 are disposed in parallel by making the stands 1, 1 proximal to each other.

Figure 10:
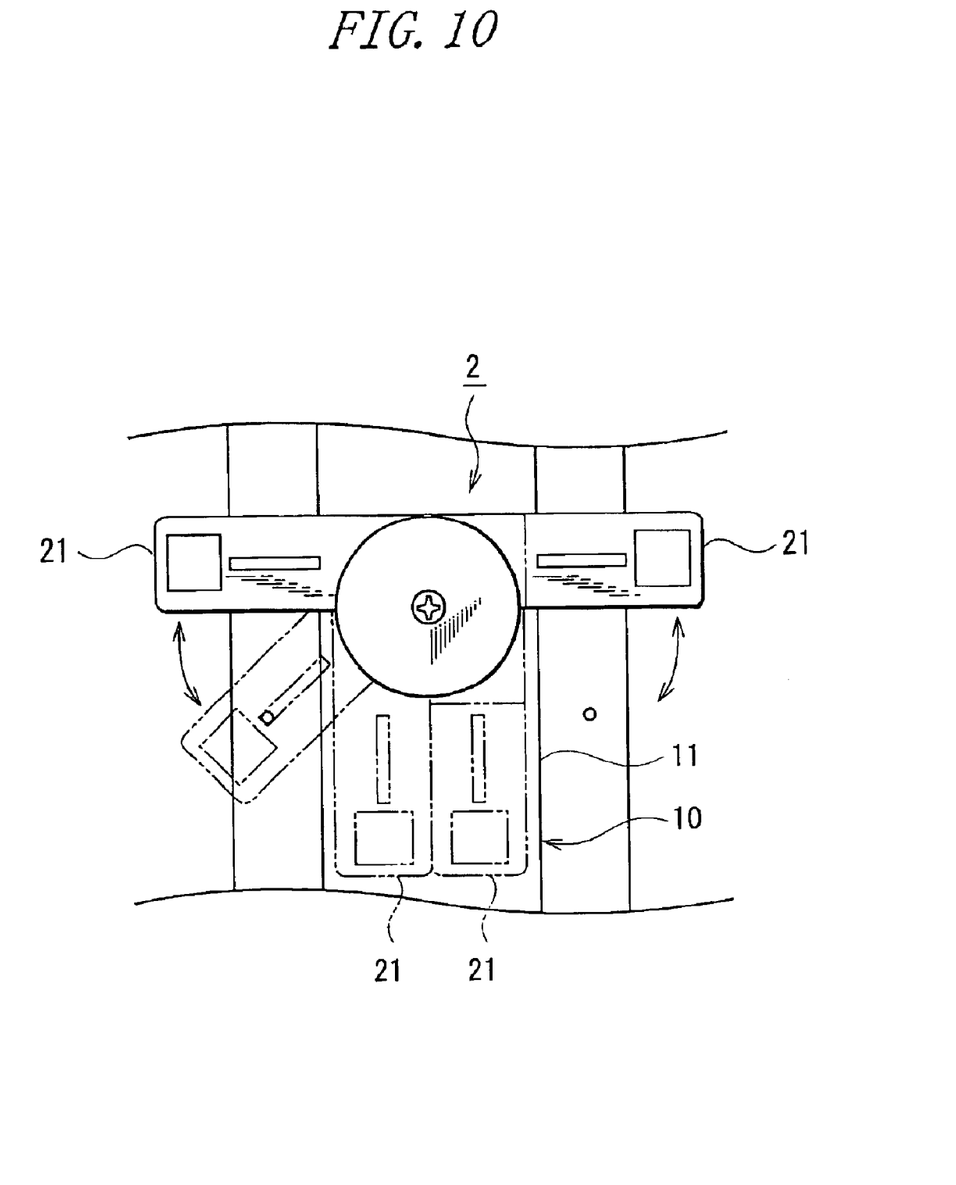
FIG. 10 is a bottom view showing another example of the prior art.

Further, FIG. 10 shows another conventional stand 2. This stand 2 includes a pair of arms 21, 21 rotatably fitted by screws to a bottom surface of the box body 11 in the peripheral device 10.

This stand 2 is structured so that the arms 21, 21 can be taken in and out of the box body 11 depending on situations. For example, in the case of installing the plurality of box bodies 11 in parallel, the arms 21, 21 are accommodated on the side of the box body 11, whereby an interval between the box bodies 11, 11 can be decreases (refers to, e.g., Japanese Patent Application Laid-Open Publication No.6-350261).

The conventional stand 1 described above has, however, a problem in which a space necessary for installation increases when installing the plurality of box bodies 11, 11 in parallel. This is because the legs 13, 13 of the stand 1 largely protrude sideways of the box body 11, resulting in an increase in the interval between the box bodies 11, 11.

Figure 11:
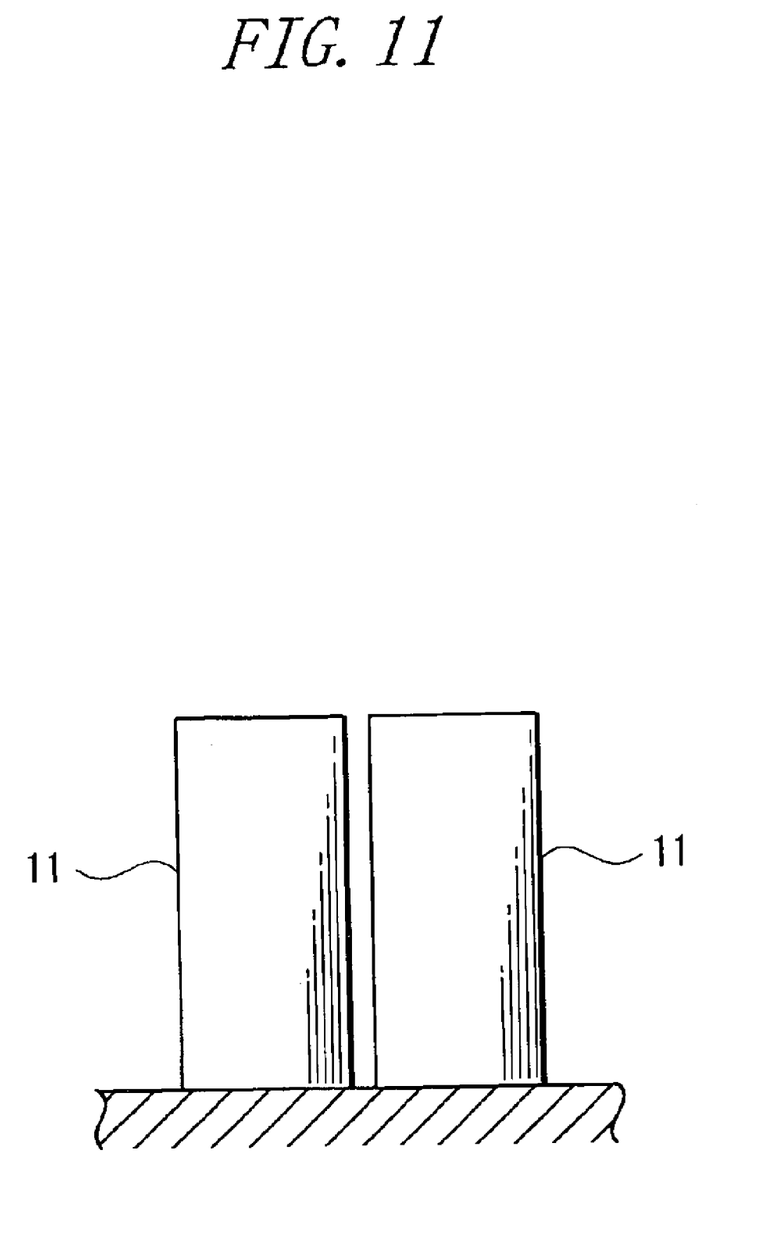
FIG. 11 is a front view showing a state where a stand is removed in the example of the prior art.

As described above, in the case of installing the plurality of box bodies 11, 11 in parallel, the interval between the box bodies 11, 11 is reduced, and hence, as illustrated in FIG. 11, it is also considered that the stand 1 is removed from the box body 11 and the box body 11 is placed erectly.

In this case, however, the box body 11 might fall down, and besides an excessively small interval between the box bodies 11, 11 might interfere with radiation of the box bodies 11, 11.

This problem arises also in a case where the arms 21, 21 of the stand 2 described above are accommodated on the side of the box body 11, and the plurality of box bodies 11 are disposed in parallel. A further problem is that this stand 2 is structured to rotatably fit the arms 21, 21 to the box body 11, and therefore its configuration becomes complicated.

SUMMARY OF THE INVENTION

It is a primary object of the present invention, which was devised to obviate the problems described above, to provide a stand for installing a plurality f box bodies, which is capable of reducing a space needed for installing a plurality of box bodies in parallel and preventing interference with radiation of the box body.

To accomplish the above object, according to one aspect of the present invention, a stand for installing a plurality of box bodies in parallel, includes a pair of outer stands holding the box bodies disposed on the outer sides from the sides of outer surfaces of the box bodies, a middle stand disposed between the pair of outer stands and holding both of the box bodies adjacent to each other from the face-to-face sides thereof, and a connection mechanism detachably connecting the stands.

Thus, according to the present invention, the plurality of box bodies are integrally held, and hence the entire width of the stand has at least a dimension obtained by adding width of all the box bodies. Therefore, the entire width of the stand can be decreased by reducing the interval between the box bodies to the greatest possible degree.

Further, even when the number of the box bodies that should be installed changes, it is possible to immediately correspond to this change by adjusting the number of the middle stands for use.

Herein, an interval of a portion, for holding the box body, of the middle stand may be set to an interval larger than a gap needed for heat radiation, at which the box bodies adjacent to each other are installed. In this case, it is feasible to prevent the box bodies from interfering with heat radiation each other.

As explained above, according to the present invention, the plurality of box bodies are integrally held, and hence the entire width becomes comparatively large for a height of the box body. It is therefore possible to prevent the box body from falling down even when reducing the interval between the box bodies.

Accordingly, the entire width of the stand can be decreased by reducing the interval between the box bodies to the greatest possible degree, whereby a space needed for installing the plurality of box bodies can be reduced and can be thus saved.

Moreover, since the interval of the portion, for holding the box body, of the middle stand is set equal to or larger than a gap necessary for heat radiation of the box bodies adjacent to each other, it is feasible to prevent the box bodies from interfering the heat radiation each other.

DETAILED DESCRIPTION OF THE PREFERRED EMBODIMENTS

Embodiments of the present invention will hereinafter be described with reference to the accompanying drawings in FIGS. 1 through 7.

In the embodiment, the present invention is applied to a stand for a family network server (a home server) defined as a peripheral device to a computer.

Figure 1:
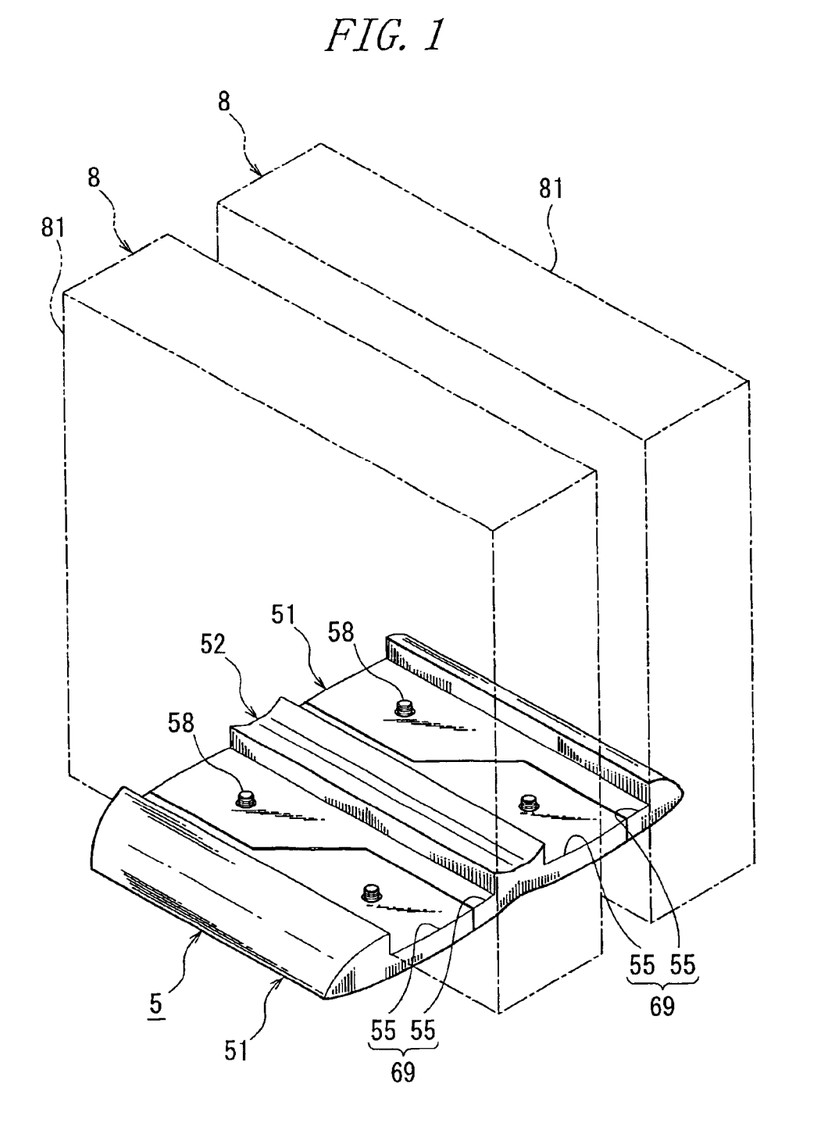
FIG. 1 is a perspective view showing an embodiment of the present invention.

FIG. 1 illustrates a stand 5 to which the present invention is applied. This stand 5 is structured with a plurality of family network servers 8 installed in parallel and in a state of vertically placed thereon. A box body 81 of each of the family network servers 8 is configured thin substantially in a rectangular parallelopiped shape.

Figure 5A:
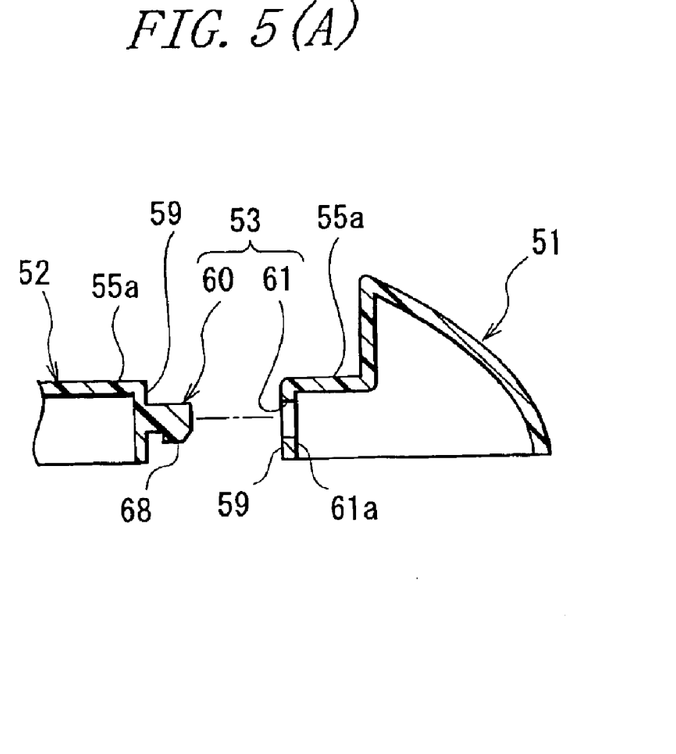
FIGS. 5(A) and 5(B) are sectional views showing a connection mechanism of the present invention.
Figure 5B:
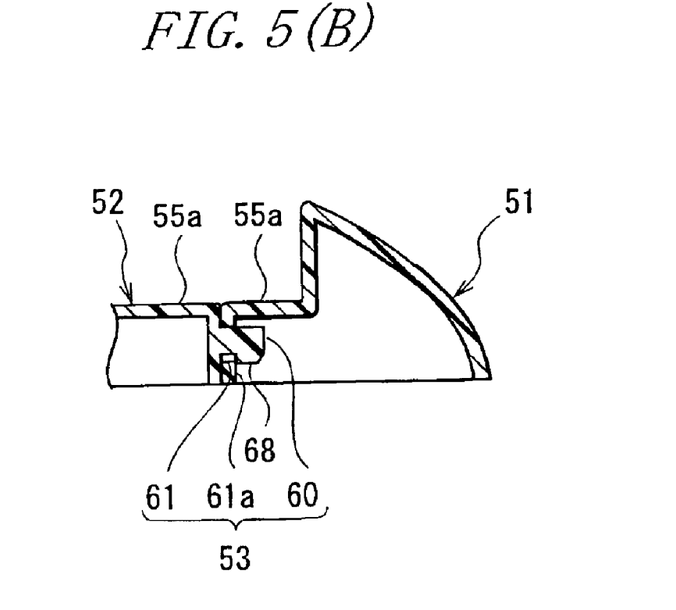

The stand 5 includes a pair of outer stands 51, 51 for supporting the outer surfaces of the box bodies 81, 81 disposed on the outsides among the plurality of box bodies 81, . . . installed in parallel, a middle stand 52, interposed between the pair of outer stands 51, 51, for supporting the face-to-face surfaces of the box bodies 81, 81 adjacent to each other, and a connection mechanism 53 (see FIG. 5) for connecting the stands 51, 52 to each other.

Figure 2:
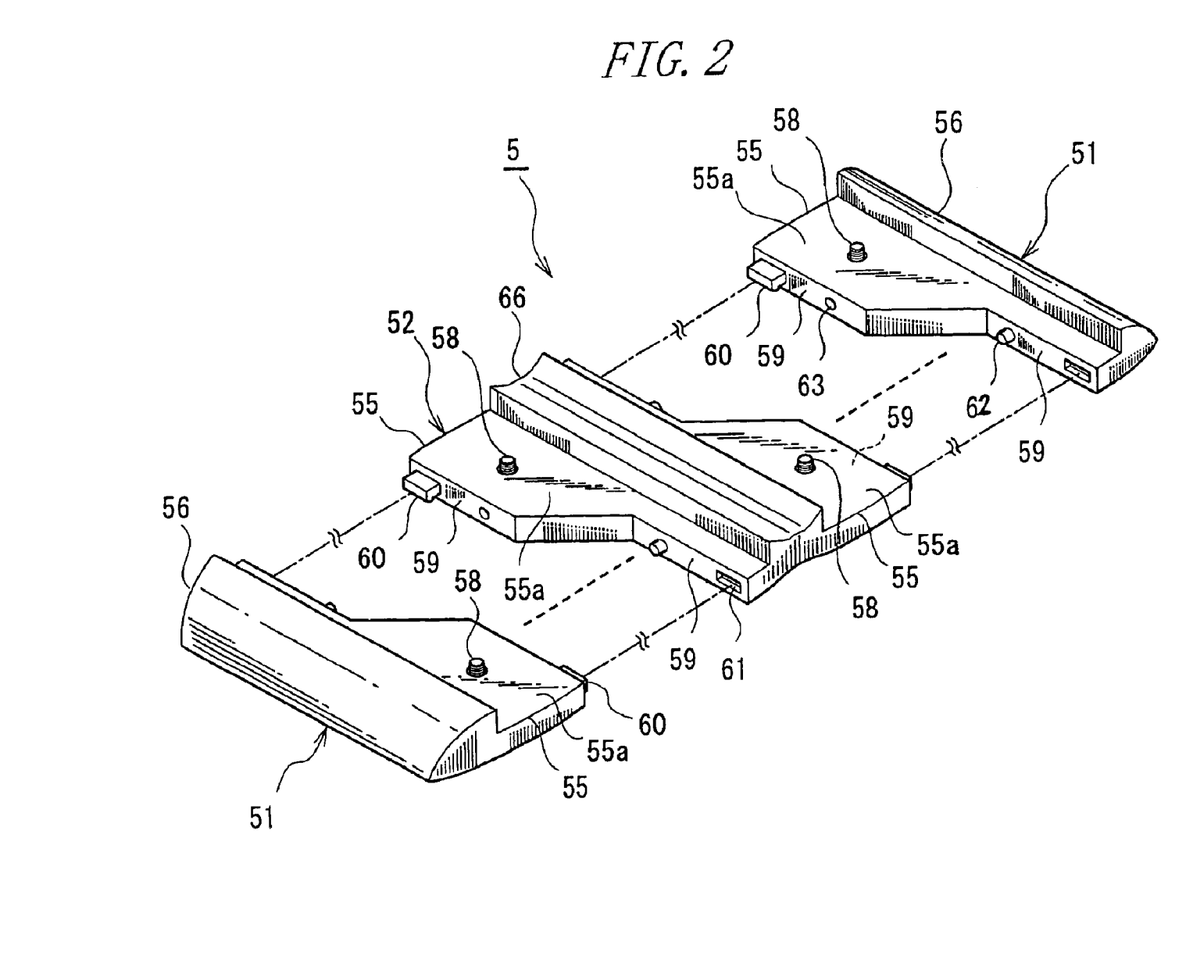
FIG. 2 is an exploded perspective view of the above-mentioned embodiment.

Next, the above-described respective constituting elements will be explained. The outer stand 51 is formed of a resin. This outer stand 51 has, as shown in FIG. 2, a recessed portion 55 taking substantially an L-shape in section, of which one side end is opened to accommodate a part of the bottom of the box body 81, and a leg 56 taking substantially a triangular shape in section and protruding sideways of this recessed portion 55.

Further, this outer stand 51 includes a set screw 58 protruding into the recessed portion 55 from a bottom surface 55a of the recessed portion 55, an engagement member 60 and an engagement hole 61 both of which are formed on and in a connection surface 59 for connection with the middle stand 52, and a projection 62 and a guide hole 63 both of which are formed on and in the connection surface 59.

The bottom surface 55a of the recessed portion 55 is formed such that the substantially half thereof is comparatively wide, but the remaining half is narrowed. The set screw 58 is rotatably secured to a wide area of the bottom surface 55a.

The engagement member 60 and the engagement hole 61, as will be explained later on, constitute the connection mechanism 53. The engagement member 60 is formed on the connection surface 59 defined by the wide area of the bottom surface 55a. Further, the engagement hole 61 is formed in the connection surface 59 defined by the narrow area of the bottom surface 55a.

The projection 62 and the guide hole 63 are fitted together when connecting the respective stands 51, 52 to each other. Lateral deviations of the stands 51, 52 are thereby prevented. The projection 62 is formed in the vicinity of the engagement hole 61. Further, the guide hole 63 is formed in the vicinity of the engagement member 60. The projection 62 and the guide hole 63 are each formed substantially in a circular shape in section.

Next, the middle stand 52 will be explained. This middle stand 52 includes the recessed portions 55, 55 provided on both sides, each taking a substantially L-shape in section, of which the outsides are opened in order to accommodate the face-to-face surfaces of the box bodies 81, 81 adjacent to each other, and a partition member 66 formed between the recessed portions 55, 55.

Further, this middle stand 52 includes the rotatable set screw 58 protruding into the recessed portion 55 from the bottom surface 55a of the recessed portion 55, the engagement member 60 and the engagement hole 61 that are formed on and in the connection surface 59 for connecting with the outer stand 51, and the projection 62 and the guide hole 63 that are formed on and in the connection surface 59.

The recessed portion 55, the set screw 58, the engagement member 60, the engagement hole 61, the projection 62 and the guide hole 63 of the middle stand 52, are the same as those of the outer stand 51, and hence the detailed explanations thereof are omitted.

Figure 3:
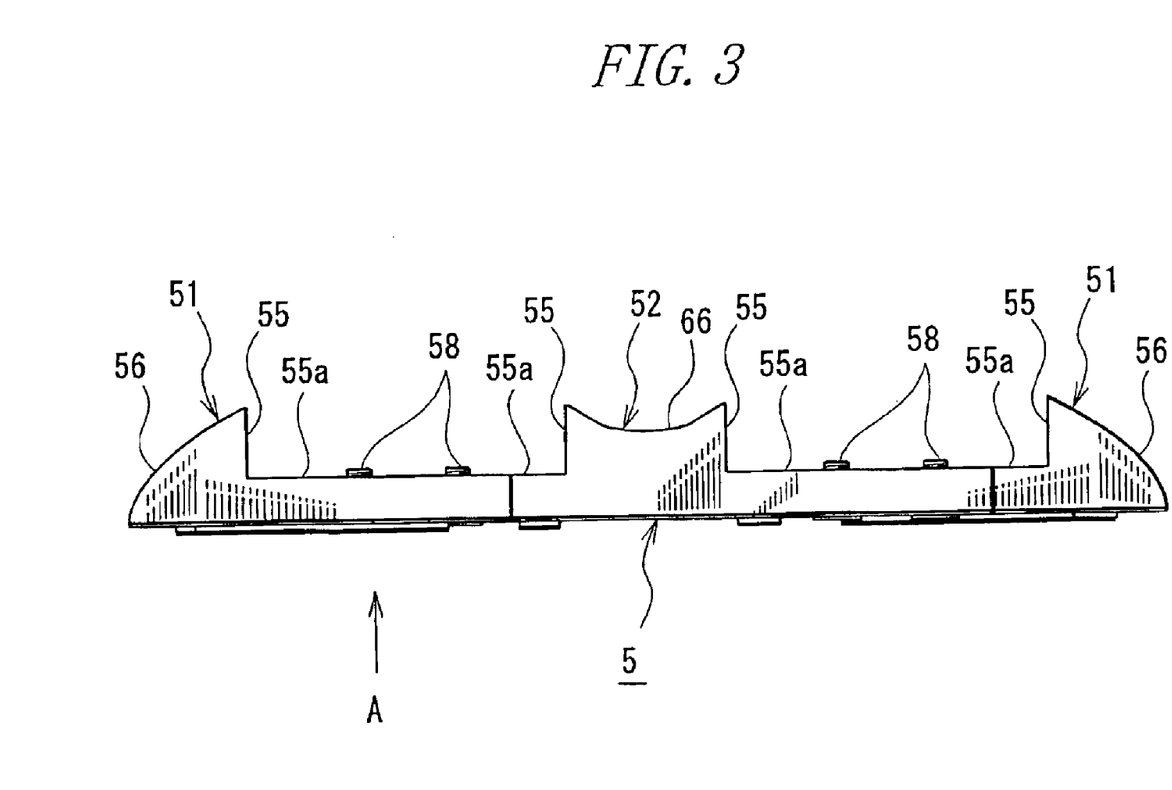
FIG. 3 is a front view of the above-mentioned embodiment.

The bottom surface 55a of the recessed portion 55 of the middle stand 52 is, however, formed in a shape opposite to the shape of the bottom surface 55a of the recessed portion 55 of the outer stand 51 connected to the middle stand 52. With this configuration, as shown in FIG. 3, the outer stand 51 and the middle stand 52 can be connected together with no gap therebetween.

Figure 4:
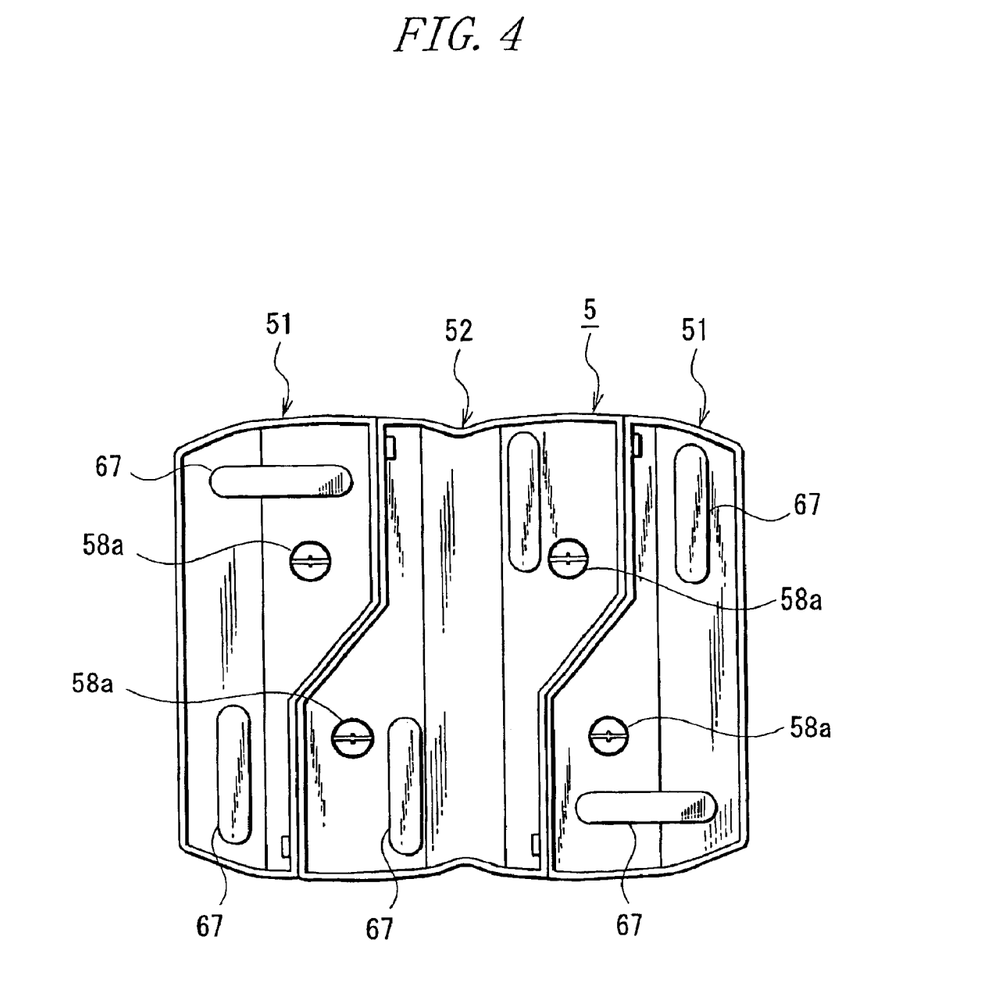
FIG. 4 is a bottom view of the above-mentioned embodiment.

Slip prevention rubber plates 67 are, as illustrated in FIG. 4, bonded to the bottom surfaces of the outer stand 51 and of the middle stand 52. Further, the reference numeral 58a in FIG. 4 is the head of the set screw 58.

Note that a gap may be formed partially or entirely between the outer stand 51 and the middle stand 52 or between the middle stands 51 in the case of connecting the plurality of middle stands 52.

Next, the connection mechanism 53 for connecting the outer stand 51 and the middle stand 52 together will be explained. Note that the connection mechanisms 53 are provided on both side ends of the connection surface 59 of each of the stands 51, 52, however, one of these two mechanisms 53 will be herein described.

This connection mechanism 53 includes, as shown in FIG. 5(a), of the outer stand 51 and the middle stand 52 that should be connected together, the engagement member 60 formed on the connection surface 59 of the middle stand 52 and the engagement hole 61 formed in the connection surface 59 of the outer stand 51.

The engagement member 60 thereof protrudes to a proper length from the connection surface 59. This engagement member 60 is formed substantially in a square shape in section. Further, a projection 68 projecting downwards is provided at the tip of the engagement member 60.

The engagement hole 61 is formed wide enough to admit the engagement member 60 into the hole 61 itself. Further, the bottom of the engagement hole 61 is formed with an engagement portion 61a with which the projection 68 of the engagement member 60 engages.

When connecting the outer stand 51 and the middle stand 52 together, as shown in FIG. 5(b), the respective connection surfaces 59 thereof are set facing to each other. At this time, the bottom surface 55a of the recessed portion 55 of the middle stand 52 is set shifted slightly upwards from the bottom surface 55a of the recessed portion 55 of the outer stand 51.

Next, the engagement member 60 of the middle stand 52 is inserted into the engagement hole 61 of the outer stand 51. Subsequently, the middle stand 52 is moved downwards. Then, the projection 68 of the engagement member 60 engages with the engagement portion 61a of the engagement hole 61.

Consequently this contrivance, the outer stand 51 and the middle stand 52 are connected together with no gap, thereby the stands 51, 52 do not come off unpreparedly. Moreover, the bottom surfaces 55a of the recessed portions 55 of the respective stands 51, 52 are flush with each other.

Figure 6:
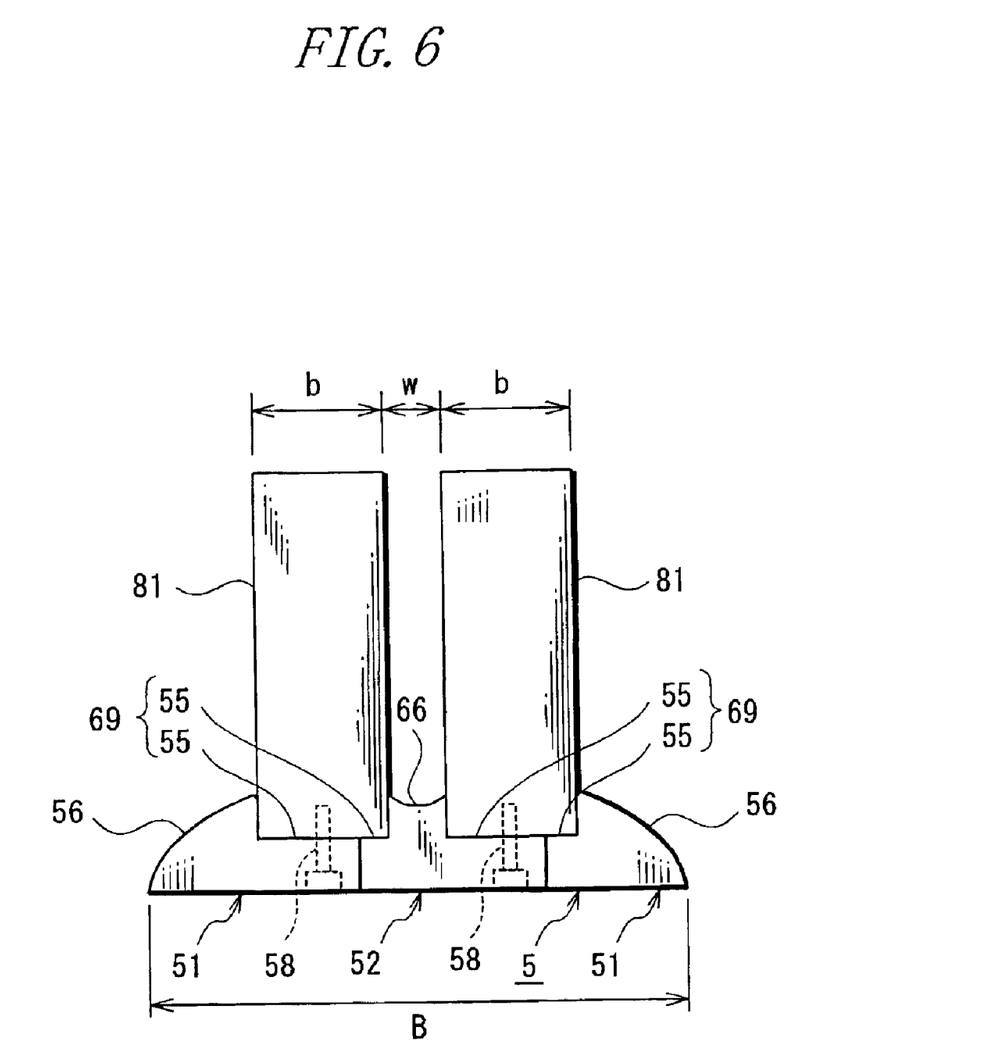
FIG. 6 is a front view showing an operation of the present invention.

Next, an operation of the stand 5 for installing the plurality of box bodies will be discussed. Now assuming that, as shown in FIG. 6, the two box bodies 81, 81 are installed in parallel, the single middle stand 52 is connected to between the pair of outer stands 51, 51.

Then, the recessed portions 55, 55 provided on both sides of the middle stand 52 get integral with the recessed portion 55 of the outer stand 51, thereby forming accommodating portions 69, 69 taking substantially a C-shape in section. This accommodating portion 69 accommodates the bottom of the box body 81. The bottom of the box body 81 is fixed to the stand 5 by the set screw 58.

At this time, an entire width B of the stand 5 is larger more than twice a width b of the box body 81 and is considerably large for a height of the box body 81. It is therefore possible to surely prevent the box bodies 81, 81 from falling down.

Further, the outer stand 51 and the middle stand 52 are connected together with no gap within the bottom surface of the box body 81, and besides there is no level difference between the connecting portions, whereby the box body 81 can be stably held.

Moreover, as described above, the entire width B of the stand 5 is at least twice the width b of the box body 81 and is therefore enough to prevent the box body 81 from falling down. Accordingly, there is no necessity of increasing an interval w (a width of the partition member 66) between the box bodies 81, 81, and this interval w can be reduced to as small as possible.

Thereby, it enables the entire width B of the stand 5 to be reduced, whereby the space needed for installing the plurality of box bodies 81 in parallel can be made smaller than that for prior art and can be thus saved.

Further, if it is required that a gap for heat radiation be formed between the box bodies 81, 81 adjacent to each other, the width w of the partition member 66 is set approximately the same as or larger than the gap needed for the heat radiation between the two box bodies 81, 81. With this arrangement, the gap between the box bodies 81, 81 can be kept constant and might not be decreased for some reason, wherein each box body 81, 81 does not interfere with the heat radiation of the opposite box body 81.

Note that the embodiment discussed above has dealt with the case of installing two box bodies 81 in parallel, however, if three or more pieces of box bodies 81 are disposed in parallel, there are prepared the middle stands 52 in the number less by one than the number of the box bodies 81. Then, these middle stands 52 are connected to between the pair of outer stands 51, 51.

Figure 7:
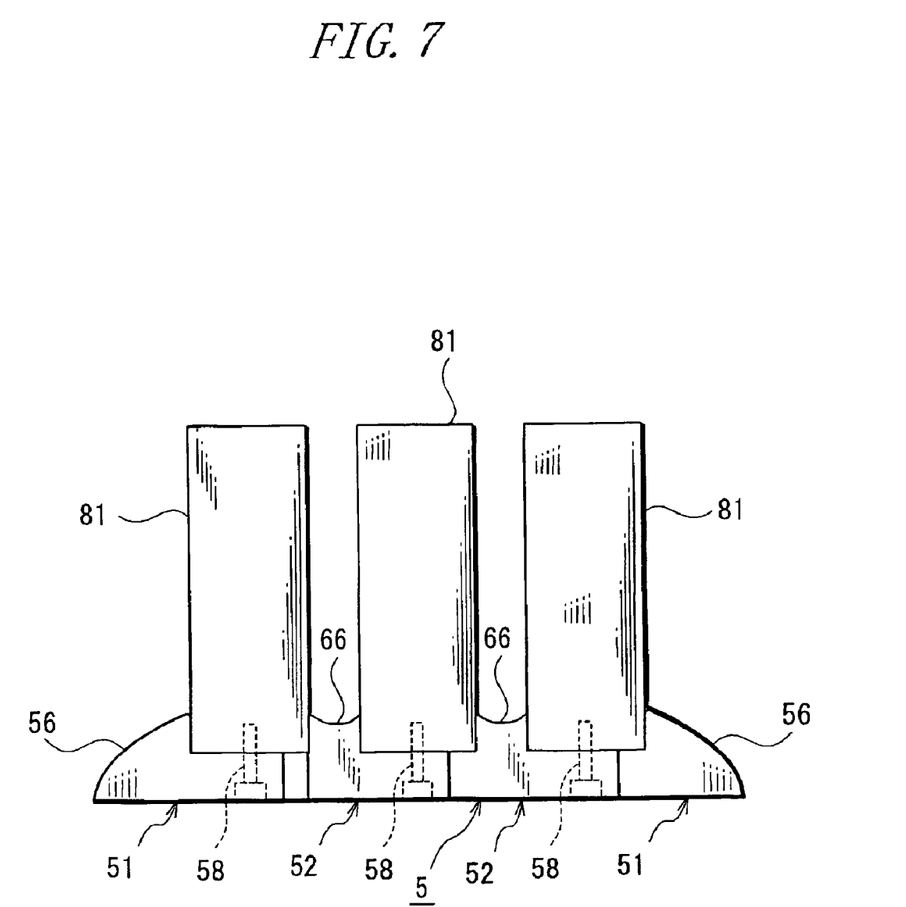
FIG. 7 is a front view showing another embodiment of the present invention.

For example, as illustrated in FIG. 7, in the case of installing three box bodies 81 in parallel, the two middle stands 52, 52 are connected to between the pair of outer stands 51, 51. The method is the same for installing four or more pieces of box bodies 81 in parallel.

Thus, in the case of installing three or more box bodies 81 in parallel, the plurality of the same middle stands 52 are used, and therefore the parts can be utilized in common. Further, even when the number of the box bodies 81 that should be installed changes, it is possible to correspond to this change simply by adjusting the number of the middle stands 52 for use.

Moreover, with this stand 5, the accommodating portion 69 formed between the outer stand 51 and the middle stand 52 accommodates the bottom of the box body 81, and there is no necessity of moving the respective components of the stand 5 with respect to the box body 81, whereby the configuration can be simplified.

Note that the embodiment discussed above has dealt with the case of installing the plurality of box bodies 81 each having the same shape and the same size, however, the present invention can be applied to a case of installing the plurality of box bodies having different shapes and different sizes.

Moreover, the embodiment discussed above has dealt with the case where the present invention is applied to the stand for installing the family network server 8, however, the present invention can be applied to the stands for installing, other than the server 8, peripheral devices to the computer and a variety of devices.

What is claimed is:

1. A stand for installing a plurality of box bodies at an interval from each other in parallel, comprising:

a pair of outer stands adapted to hold the box bodies disposed on the outer sides from the sides of outer surfaces of the box bodies;

a middle stand disposed between the pair of outer stands and adapted to hold both of the box bodies adjacent to each other from the face-to-face sides thereof;

a connecting element detachably connecting the stands, wherein each of said outer stands is provided with a recessed portion taking substantially an L-shaped in section adapted to accommodate a part of the outer side of the bottom of each of the box bodies, and wherein both sides of the middle stand are provided with recessed portions taking substantially an L-shaped in section adapted to accommodate the face-to-face sides of the bottom of each of the box bodies; and a partition member formed between both sides of the recessed portions of the middle stand taking substantially an L-shaped in section adapted to be disposed between the box bodies adjacent to each other, and wherein a plurality of accommodating portions taking substantially a C-shaped in section are formed for accommodating the bottom of each of the box bodies by integrating the recessed portions substantially taking an L-shaped in section in both stands adjacent to each other and the plurality of the accommodating portions are arranged at an interval from each other.

2. A stand for installing a plurality of box bodies according to claim 1, wherein the partition member of the middle stand has a width allowing for heat radiation between the adjacent box bodies.

3. A stand for installing a plurality of box bodies according to claim 1, wherein the box body is substantially in a rectangular parallelopiped body.

4. A stand for installing a plurality of box bodies according to claim 1, wherein the plurality of box bodies are substantially in the same size.

5. A stand for installing a plurality of box bodies according to claim 1, wherein the box body is a peripheral equipment of a computer.

6. A stand for installing a plurality of box bodies according to claim 1, wherein the box body is a server.

* * * * *